(12) United States Patent
Lin

(10) Patent No.: US 7,133,487 B2
(45) Date of Patent: Nov. 7, 2006

(54) LEVEL SHIFTER

(75) Inventor: Kun Tsung Lin, Taichung (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 77 days.

(21) Appl. No.: 10/978,364

(22) Filed: Nov. 2, 2004

(65) Prior Publication Data

US 2005/0134311 A1 Jun. 23, 2005

(30) Foreign Application Priority Data

Dec. 22, 2003 (TW) .............................. 92136413 A

(51) Int. Cl.
*H03K 19/175* (2006.01)
(52) U.S. Cl. .............................. 376/68; 326/80; 326/81
(58) Field of Classification Search .................. 326/68, 326/80–81; 327/333
See application file for complete search history.

(56) References Cited

U.S. PATENT DOCUMENTS

| 4,039,862 A | * | 8/1977 | Dingwall et al. ............ 327/333 |
| 2003/0132778 A1 | * | 7/2003 | Gion ............................ 326/80 |
| 2003/0174007 A1 | * | 9/2003 | Suga ........................... 327/333 |

* cited by examiner

*Primary Examiner*—Anh Q. Tran
(74) *Attorney, Agent, or Firm*—Bacon & Thomas, PLLC

(57) ABSTRACT

A level shifter has a pair of P-type MOS transistor switches, a pair of N-type MOS transistor switches, an inverter and a plurality of triggers. The triggers are connected to gates of high-voltage devices (N-type MOS transistor switches) and substrates of the high-voltage devices, so that the triggers can produce a trigger signal for a period of time after receiving a low voltage control signal in order to change voltages on the substrates at transition and further reduce threshold voltages of the substrates to increase transition speed of the shifter circuit.

26 Claims, 6 Drawing Sheets

LEVEL SHIFTER

BACKGROUND OF THE INVENTION

1. Field of the Invention

The present invention relates to the level shifter and, more particularly, to a level shifter for high-voltage level conversion.

2. Description of Related Art

Level shifters are generally applied for low voltage signal to high voltage signal conversion. For example, a large scale liquid crystal display (LCD) requires 20 to 40V signal to turn on thin-film transistors (TFTs) but an input signal applied to the LCD Driver IC is 3V. In this case, a level shifter is applied for the voltage conversion.

FIG. 1 is a circuit of a typical level shifter. As shown, the level shifter includes two PMOSs 11, 12, two NMOSs 13, 14 and an inverter 15. The sources of the PMOSs 11, 12 are connected to a node 16 for providing with an external high voltage HVDD. The sources of the NMOSs 13, 14 are connected to a node 17 for providing with an external low voltage VSS. The drains of the PMOS 11 and NMOS 13 are connected to a node ND1 while the drains of the PMOS 12 and NMOS 14 are connected to a node ND2. Also, the node ND1 is connected to the gate of the PMOS 12 while the node ND2 is connected to the gate of the PMOS 11. In addition, an output terminal OUT is connected to the node ND 1, and an input terminal IN is connected to the gate of the NMOS 14 and also to the gate of the NMOS 13 through the inverter 15. As such, input control signals from the input terminal IN can control the PMOSs 11 and 12 and the NMOSs 13 and 14 on/off, and accordingly the output terminal OUT outputs the high voltage HVDD or the low voltage VSS.

For meeting low input voltage (such as 3V) and high output voltage (such as 40V), the NMOSs 13, 14 typically are high-voltage devices. To achieve this, width/length ratio W/L for the NMOSs 13, 14 is raised while that for the PMOSs 11, 12 is lowered. However, the drain capacitance on the NMOSs 13, 14 becomes more as the W/L is raised too high, and the operating current becomes smaller as the W/L of the PMOSs 11, 12 is lowered. Such a way causes longer transition time on a level shifter and more power consumption.

Further, since the NMOSs 13, 14 have to use high-voltage devices, their threshold voltages are higher. If input voltage is reduced to very low, saturation currents on the NMOSs 13, 14 become smaller so that the voltage shifter is more difficult on level transition and circuit design.

FIG. 2 is a circuit of another typical level shifter, which is similar to that of FIG. 1 except that a PMOS 25 between the PMOS 21 and NMOS 23 and a PMOS 26 between the PMOS 22 and NMOS 24 are added as impedance for current limit. However, the NMOSs 23, 24 still require larger area and current limit provided by the PMOSs 25, 26 is limited.

Therefore, it is desirable to provide an improved level shifter to mitigate and/or obviate the aforementioned problems.

SUMMARY OF THE INVENTION

An object of the invention is to provide a level shifter, which can reduce transition time to speed transition of the level shifter.

Another object of the invention is to provide a level shifter, which can allow the shifter circuit to work at a lower input voltage.

A further object of the invention is to provide a level shifter, which can reduce short current by shortening transition time and lower current consumption to save power.

In accordance with one aspect of the present invention, there is provided a level shifter, which includes a first switch circuit, a second switch circuit, a first trigger and a second trigger. The first switch circuit has a first switch and a second switch. The second switch circuit has a third switch and a fourth switch. The first switch and the second switch have a first terminal, a second terminal and a third terminal respectively. The first terminals of the first and the second switches are connected to a high voltage node. The third switch and the fourth switch have a fourth terminal, a fifth terminal and a sixth terminal respectively. The fourth terminal of the third switch is connected to the third terminal of the first switch and the second terminal of the second switch respectively. The fourth terminal of the fourth switch is connected to the second terminal of the first switch and the third terminal of the second switch respectively. The sixth terminals of the third and the fourth switches are connected to a low voltage node. The fifth terminal of the third switch receives an input control signal and the fifth terminal of the fourth switch receives a phase-inverted signal with respect to the input control signal. The third switch and the fourth switch are connected to the first trigger and the second trigger respectively for dynamically changing respective substrates and reducing respective threshold voltages.

In accordance with another aspect of the present invention, there is provided a level shifter, which includes a first switch circuit and a second switch circuit. The first switch circuit has a plurality of first switches and the second switch circuit has a plurality of second switches. The first switch circuit is connected to a first voltage node and the second switch circuit is connected to a second voltage node. When the first voltage node is a high level and the second voltage node is a low level, the second switch circuit is connected to at least one trigger. The second switch circuit and the at least one trigger receive a low voltage control signal respectively such that the second switches are switched to invoke corresponding switching on the first switches. The at least one trigger produces a trigger signal for a predetermined interval so as to change substrate voltage of at least one second switch when the first switch circuit and the second switch circuit are operated in transition, thereby reducing threshold voltage of the at least one second switch to speed circuit transition and output a high-voltage control signal.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
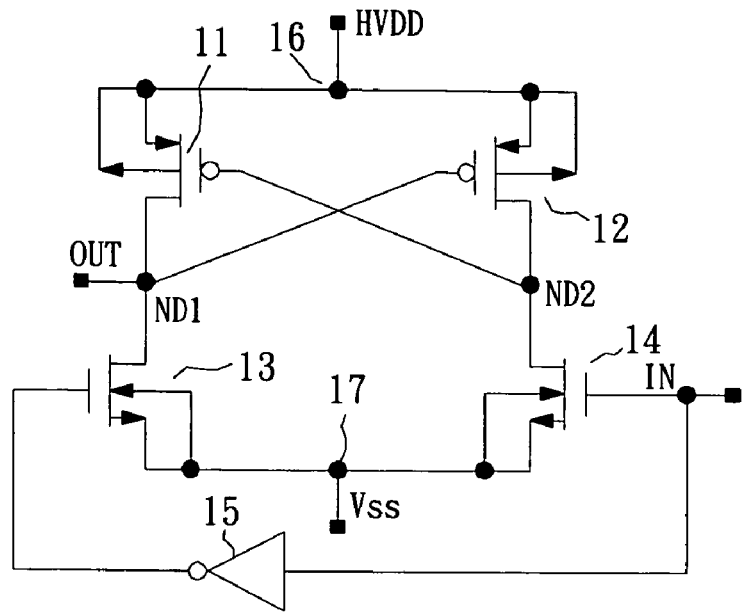
FIG. 1 is a circuit of a typical level shifter.
Figure 2:
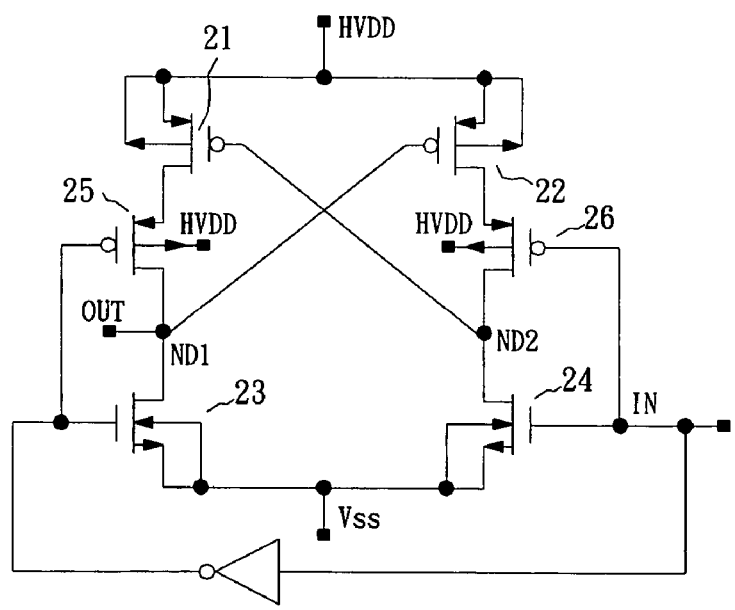
FIG. 2 is a circuit of another typical level shifter.
Figure 3:
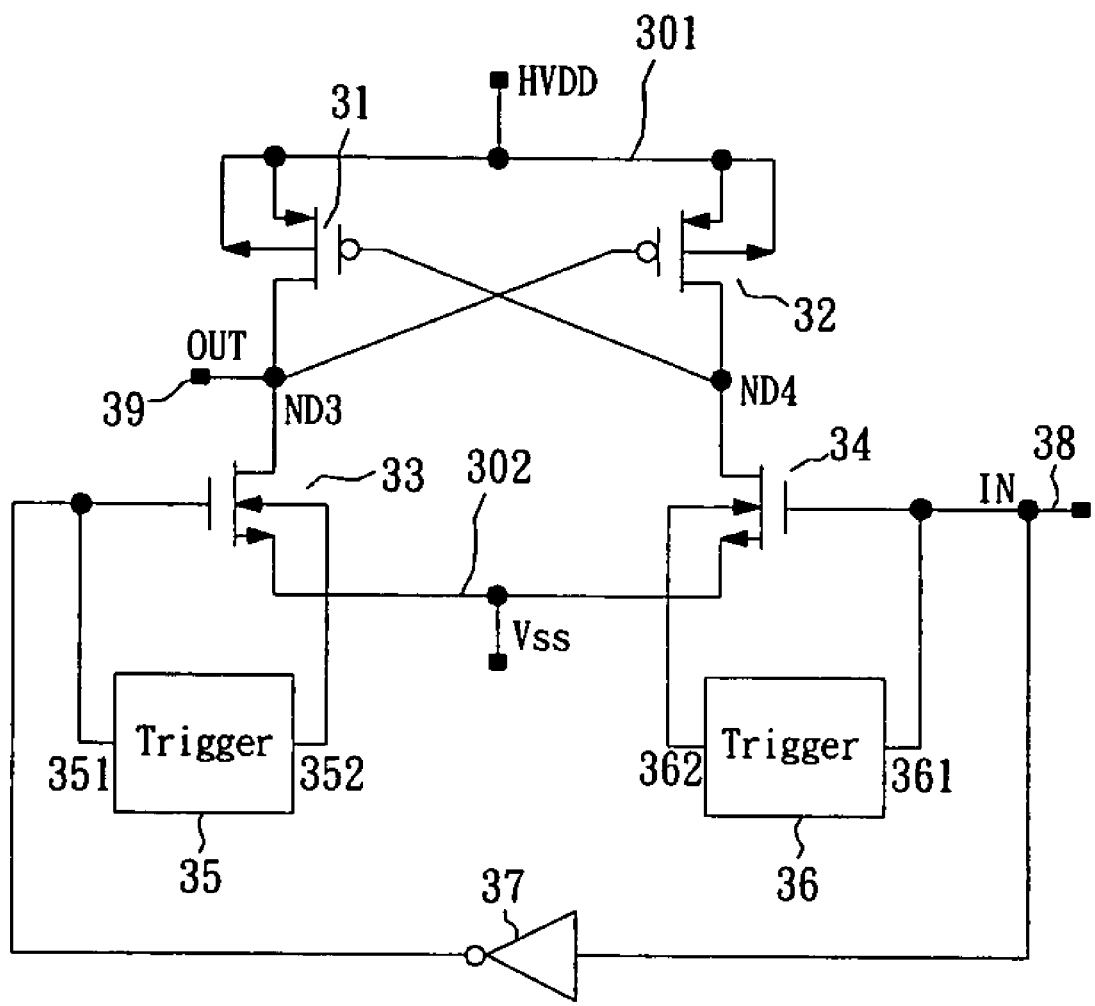
FIG. 3 is a level shifter circuit of a first embodiment in accordance with the invention.

With reference to FIG. 3, there is shown a circuit of a level shifter of a first embodiment in accordance with the invention. As shown, the shifter includes two PMOSs 31, 32, two NMOSs 33, 34, two triggers 35, 36 and an inverter 37.

The sources of the PMOSs 31, 32 are connected to a node 301 for providing the circuit with an external high voltage HVDD (such as 40V). The sources of the NMOSs 33, 34 are connected to a node 302 for providing with an external low voltage VSS (such as 0V).

The drains of the PMOS 31 and NMOS 33 are connected to a node ND3 while the drains of the PMOS 32 and NMOS 34 are connected to a node ND4. Also, the node ND3 is connected to the gate of the PMOS 32 while the node ND4 is connected to the gate of the PMOS 31. In addition, an output terminal 39 is connected to the node ND3, and an input terminal 38 is connected to the gate of the NMOS 34 and also to the gate of the NMOS 33 through the inverter 37.

The triggers 35 and 36 are connected across the NMOSs 33 and 34. Namely, the trigger 35 has an input terminal 351 connected to the gate of the NMOS 33 and an output terminal 352 connected to the substrate of the NMOS 33 in order to control the substrate voltage and further change threshold voltage of the NMOS 33. Also, the trigger 36 has an input terminal 361 connected to the gate of the NMOS 34 and an output terminal 362 connected to the substrate of the NMOS 34 to control the substrate voltage and further change threshold voltage of the NMOS 34.

With the triggers 35, 36, the substrate voltages of the NMOSs 33, 34 are raised to reduce the respective threshold voltages and turn on parasitic bipolar junction transistors (BJTs) between the substrate and source, drain so as to increase current flow. Accordingly, the level shifter can be converted into different levels easily.

With the improvement of the semiconductor process, current wafer manufactures offer various separate substrates for high voltage device processes. As such, the triggers 35, 36 can change the substrate voltages of high voltage devices (in this case, NMOSs 33, 34) by the output terminals 352, 362. In addition, the action of changing the substrate voltages by the triggers 35, 36 is independent, without changing other devices (such as another high voltage device), and results in the same or different changed substrate voltages.

Figure 4A:
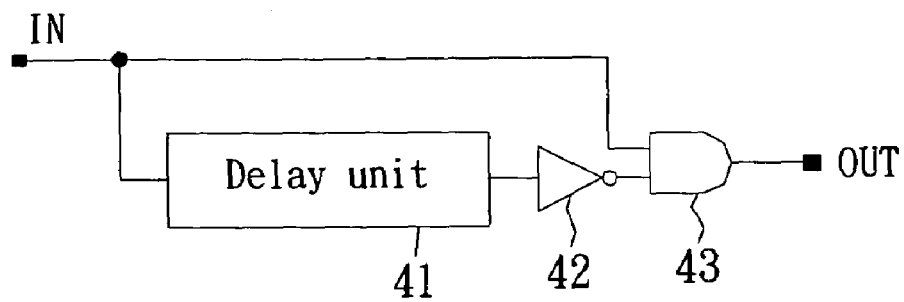
FIG. 4A is a schematic diagram of a trigger of FIG. 3 in accordance with the invention.
Figure 4B:
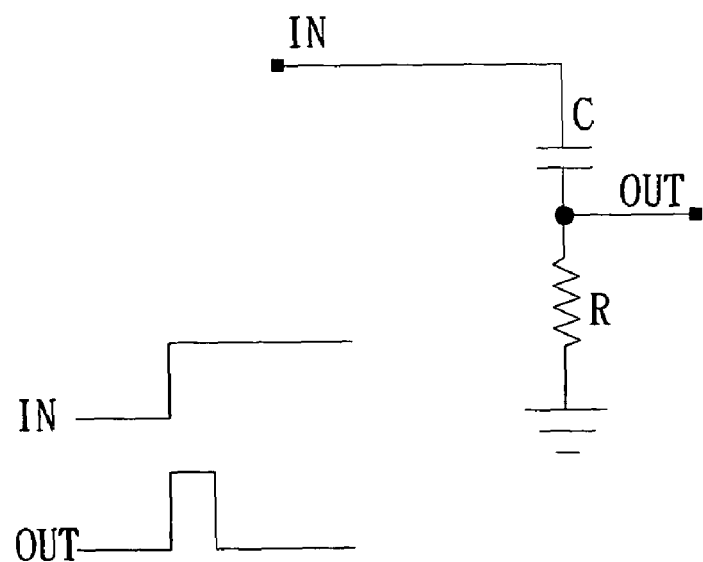
FIG. 4B is a circuit of another trigger of FIG. 3 in accordance with the invention.

FIG. 4A shows a trigger circuit. As shown, the trigger includes a delay unit 41, an inverter 42 and an AND gate. The delay unit 41 can be implemented by a string of inverter. In this trigger, as its input terminal IN is in transition from low into high potential, its output terminal OUT produces a trigger signal for a predetermined time equal to a delay time produced by the delay unit 41. FIG. 4B shows another trigger circuit, i.e., an RC delay circuit. Similarly, in this trigger, as its input terminal IN is in transition from low into high potential, its output terminal OUT produces a trigger signal for a predetermined time equal to an RC charge time produced by the RC delay circuit.

Next, referring again to FIG. 3, when the input terminal 38 inputs a low voltage control signal (such as 3V), the low voltage control signal turns on the NMOS 34. Also, the low voltage control signal is input to the input terminal 361 of the trigger 361 to provide a trigger signal for a predetermined time in order to change the substrate voltage of the NMOS 34 and thus reduce the threshold voltage of the NMOS 34. As such, the parasitic BJTs are turned on. The predetermined time is sufficient to complete transition of the level shifter. Also, the low voltage control signal is input to the inverter 37 and further to the NMOS 33 and the trigger 35, thereby turning off the NMOS 33.

Since the NMOS 34 is in on state and the NMOS 33 is in off state, the PMOS 31 is turned on and PMOS 32 is turned off, thereby outputting a high voltage control signal. In addition, the trigger signals produced by the triggers 35 and 36 at transition reduce threshold voltages of the NMOSs 34 and 33 and turn on the parasitic BJTs, thereby speeding transition time.

Figure 5:
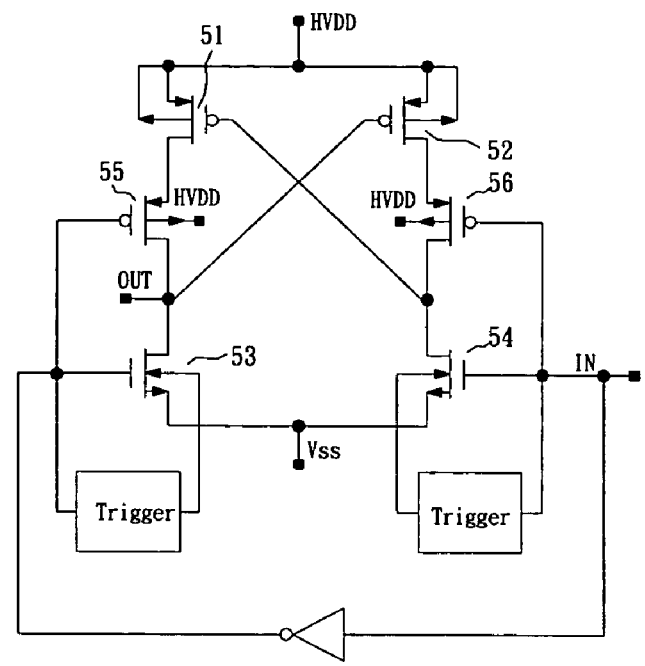
FIG. 5 is a level shifter circuit of a second embodiment in accordance with the invention.

FIG. 5 is a level shifter circuit of a second embodiment in accordance with the invention. As shown, the shifter is similar to the first embodiment except for additional PMOSs 55 and 56. The PMOS 55 is coupled between the PMOS 51 (equivalent to the PMOS 31) and the NMOS 53 (equivalent to the NMOS 33) while the PMOS 56 is coupled between the PMOS 52 (equivalent to the PMOS 32) and the NMOS 54 (equivalent to the NMOS 34), thereby obtaining current limit to reduce areas of the NMOS 53, 54 and further increase transition speed.

Figure 6:
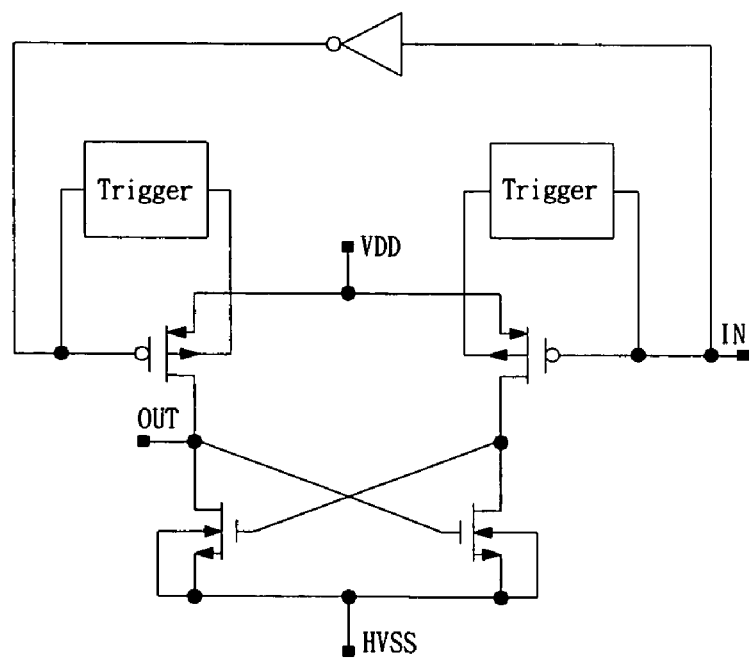
FIG. 6 is a level shifter circuit of a third embodiment in accordance with the invention.
Figure 7:
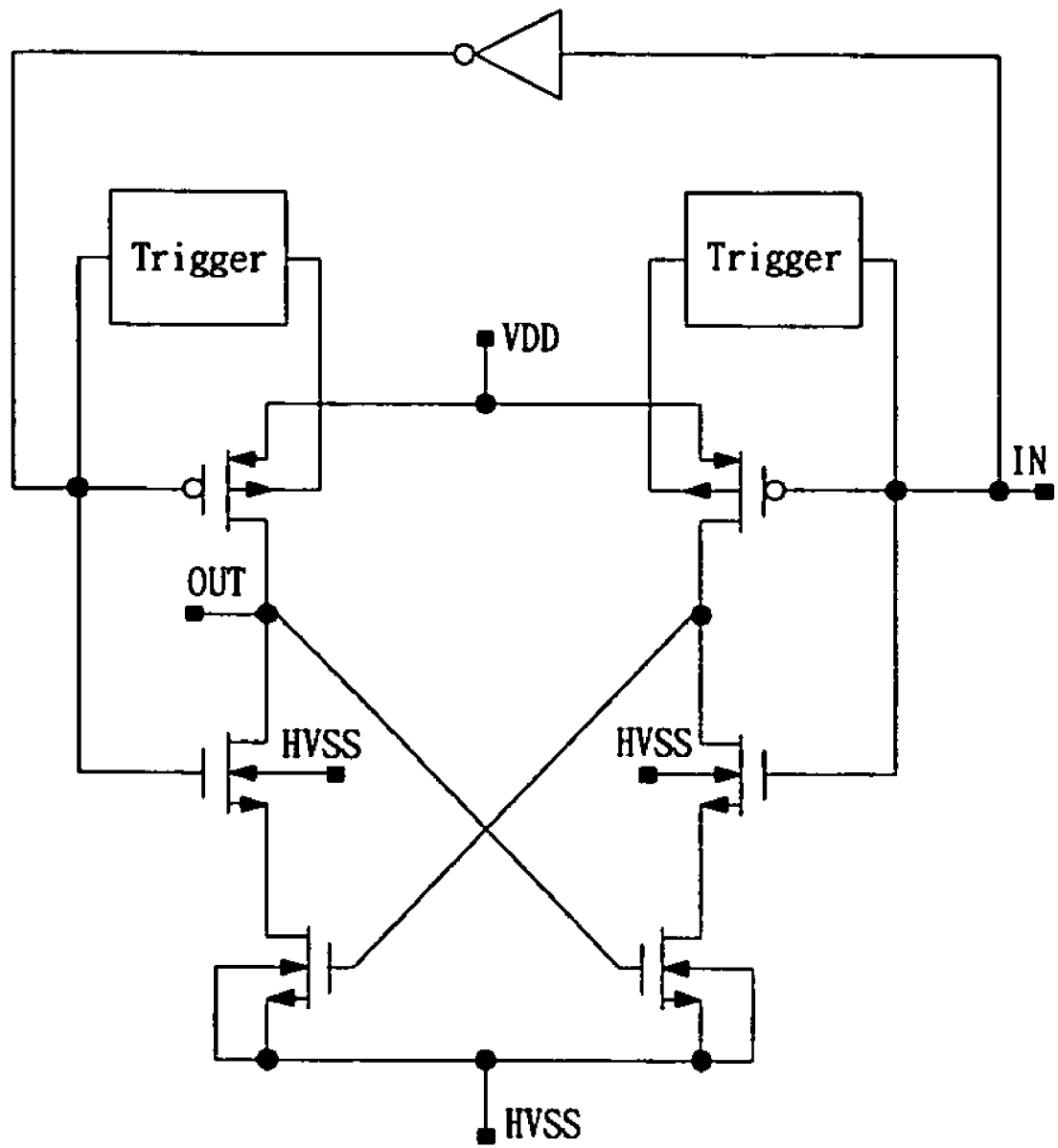
FIG. 7 is a level shifter circuit of a fourth embodiment in accordance with the invention.

FIG. 6 is a level shifter circuit of a third embodiment. FIG. 7 is a level shifter circuit of a fourth embodiment. FIGS. 6 is similar to FIG. 3 but positions of PMOSs and NMOSs are exchanged in FIG. 6 to obtain a respective inverse output signal, i.e., output voltage HVSS, and so is FIG. 7 similar to FIG. 5. Accordingly, operations and connections of FIGS. 6 and 7 are not described repeatedly.

Figure 8:
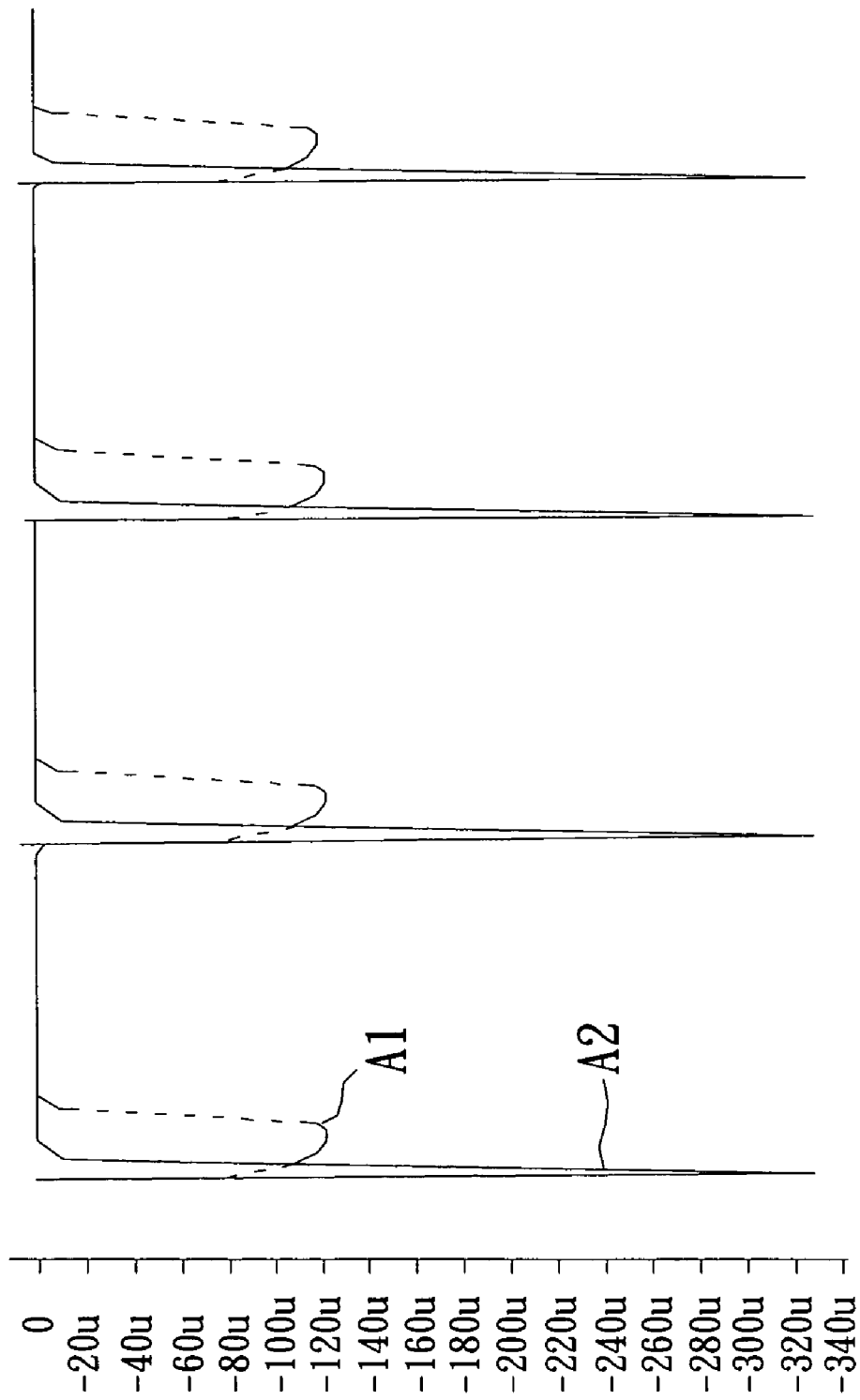
FIG. 8 is a graph of current comparison of changing substrate voltage with and without use of a trigger signal.

FIG. 8 is a graph of current comparison of changing the substrate voltage with (invention) and without (prior art) use of a trigger signal. As shown, A1 and A2 curves respectively represent currents under no use and use of a trigger signal to change the substrate voltage. Since the reduced threshold voltages of high voltage devices can cause increase of leakage current, the invention applies the triggers to change the substrate voltages at transition moment and restore the circuit to normality after transition, so that leakage current is not produced continuously. As such, entire current in A2 curve is smaller than that in A1 curve.

Further, upon simulation, the invention that uses a trigger signal to change the substrate voltages requires total power consumption as $P_{total}=P_{HVDD}$(power consumption on HVDD)+$P_{VDD}$(power consumption on VDD, which is the power supply of the inverter and the trigger circuit)=$1.587e^{-4}+6.254e^{-5}=2.212e^{-4}$(W), and the prior art that does not use a trigger signal to change the substrate voltages requires total power consumption as $P_{total}=P_{HVDD}+P_{VDD}=3.384e^{-4}+1.711e^{-6}=3.401e^{-4}$(W). Accordingly, for high voltage devices, the invention can have less power consumption on changing substrate voltages than the prior art. In addition, entire power consumption is less in the invention having triggers than in the prior art having no triggers.

As cited, the invention uses the triggers to connect high voltage devices for dynamically changing substrate voltages of the high voltage devices at transition moment of entire level shifter circuit, thereby reducing the threshold voltages of the devices and turning on parasitic BJTs of the devices. Therefore, circuit transition speed is increased and entire power consumption is less.

Although the present invention has been explained in relation to its preferred embodiment, it is to be understood that many other possible modifications and variations can be made without departing from the spirit and scope of the invention as hereinafter claimed.

What is claimed is:

1. A level shifter, comprising:
a first switch circuit having a first switch and a second switch, each having a first terminal, a second terminal and a third terminal, wherein the first terminals of the first and the second switches are connected to a high voltage node;
a second switch circuit having a third switch and a fourth switch, each having a fourth terminal, a fifth terminal and a sixth terminal, wherein the fourth terminal of the third switch is connected to the third terminal of the first switch and the second terminal of the second switch, the fourth terminal of the fourth switch is connected to the second terminal of the first switch and the third terminal of the second switch, the sixth terminals of the third and the fourth switches are connected to a low voltage node, the fifth terminal of the third switch receives an input control signal and the fifth terminal of the fourth switch receives an inverted input control signal; and
first and second triggers having a delay unit, an inverter and an AND gate respectively and connected across the third and the fourth switches for dynamically changing respective substrate voltages of the third and the fourth switches, thereby reducing respective threshold voltages of the third and the fourth switches and turning on respective parasitic bipolar junction transistors (BJTs) on the third and the fourth switches.

2. The level shifter as claimed in claim 1, wherein the first and second triggers respectively receive the input control signal and the inverse signal, and produce a respective trigger signal for a predetermined interval, thereby changing respective substrate voltages of the third and the fourth switches as the level shifter is at transition.

3. The level shifter as claimed in claim 1, wherein the first trigger changes a substrate voltage of the third switch to increase current and transition speed of the third switch.

4. The level shifter as claimed in claim 1, wherein the second trigger changes a substrate voltage of the fourth switch to increase current and transition speed of the fourth switch.

5. The level shifter as claimed in claim 1, wherein substrate voltages changed on the third and the fourth switches are the same.

6. The level shifter as claimed in claim 1, wherein substrate voltages changed on the third and the fourth switches are different.

7. The level shifter as claimed in claim 1, further comprising a fifth switch coupled between the first and the third switches, and a sixth switch coupled between the second and the fourth switches, thereby providing a function of current limit.

8. The level shifter as claimed in claim 7, wherein the fifth and the sixth switches have a seventh terminal, an eighth terminal and a ninth terminal respectively, the seventh terminal of the fifth switch connected to the third terminal of the first switch, the ninth terminal of the fifth switch connected to the fourth terminal of the third switch, the seventh terminal of the sixth switch and the third terminal of the second switch, and the ninth terminal of the sixth switch and the fourth terminal of the fourth switch.

9. The level shifter as claimed in claim 7, wherein the first, the second, the fifth and the sixth switches are PMOS transistors, and the third and the fourth switches are NMOS transistors.

10. A level shifter, comprising:
a first switch circuit having a plurality of first switches connected to a first voltage node;
a second switch circuit having a plurality of second switches connected to a second voltage node,
wherein when the first voltage node is a high voltage node and the second voltage node is a low voltage node, the second switch circuit is connected to a trigger having a delay unit, an inverter and an AND gate, the second switch circuit and the trigger receive a low voltage control signal respectively for the second switches to switch and further invoke the first switches to switch, the trigger produces a trigger signal for a predetermined interval such that substrate voltage of at least one second switch is changed when the first switch circuit and the second switch circuit are at transition, thereby reducing a threshold voltage of the at least one second switch and increasing circuit transition speed to output a high voltage control signal.

11. The level shifter as claimed in claim 10, wherein the first voltage node is a low positive voltage node and the second voltage node is a high negative voltage node, the first switch circuit is connected to a first trigger having a delay unit, an inverter and an AND gate, the first switch circuit and the first trigger receive a low voltage control signal respectively for the first switches to switch and further invoke the second switches to switch, and the first trigger produces a trigger signal for a predetermined time such that substrate voltage of at least one first switch is changed when the first switch circuit and the second switch circuit are at transition.

12. The level shifter as claimed in claim 10, further comprising third and fourth switches coupled between the first and the second switch circuits, thereby providing a function of current limit.

13. The level shifter as claimed in claim 12, wherein the first switches, the third switch and the fourth switch are P-type MOS transistors, and the second switches are N-type MOS transistors.

14. A level shifter, comprising:
a first switch circuit having a first switch and a second switch, each having a first terminal, a second terminal and a third terminal, wherein the first terminals of the first and the second switches are connected to a high voltage node;
a second switch circuit having a third switch and a fourth switch, each having a fourth terminal, a fifth terminal and a sixth terminal, wherein the fourth terminal of the third switch is connected to the third terminal of the first switch and the second terminal of the second switch, the fourth terminal of the fourth switch is connected to the second terminal of the first switch and the third terminal of the second switch, the sixth terminals of the third and the fourth switches are connected to a low voltage node, the fifth terminal of the third switch receives an input control signal and the fifth terminal of the fourth switch receives an inverted input control signal; and
first and second triggers which are respectively an RC delay circuit consisting of a resistor and a capacitor and connected across the third and the fourth switches for dynamically changing respective substrate voltages of the third and the fourth switches, thereby reducing respective threshold voltages of the third and the fourth switches and turning on respective parasitic bipolar junction transistors (BJTs) on the third and the fourth switches.

15. The level shifter as claimed in claim 14, wherein the first and second triggers respectively receive the input control signal and the inverse signal, and produce a respective trigger signal for a predetermined interval, thereby changing respective substrate voltages of the third and the fourth switches as the level shifter is at transition.

16. The level shifter as claimed in claim 14, wherein the first trigger changes a substrate voltage of the third switch to increase current and transition speed of the third switch.

17. The level shifter as claimed in claim 14, wherein the second trigger changes a substrate voltage of the fourth switch to increase current and transition speed of the fourth switch.

18. The level shifter as claimed in claim 14, wherein substrate voltages changed on the third and the fourth switches are the same.

19. The level shifter as claimed in claim 14, wherein substrate voltages changed on the third and the fourth switches are different.

20. The level shifter as claimed in claim 14, further comprising a fifth switch coupled between the first and the third switches, and a sixth switch coupled between the second and the fourth switches, thereby providing a function of current limit.

21. The level shifter as claimed in claim 20, wherein the fifth and the sixth switches have a seventh terminal, an eighth terminal and a ninth terminal respectively, the seventh terminal of the fifth switch connected to the third terminal of the first switch, the ninth terminal of the fifth switch connected to the fourth terminal of the third switch, the seventh terminal of the sixth switch and the third terminal of the second switch, and the ninth terminal of the sixth switch and the fourth terminal of the fourth switch.

22. The level shifter as claimed in claim 20, wherein the first, the second, the fifth and the sixth switches are PMOS transistors, and the third and the fourth switches are NMOS transistors.

23. A level shifter, comprising:
a first switch circuit having a plurality of first switches connected to a first voltage node;
a second switch circuit having a plurality of second switches connected to a second voltage node,
wherein when the first voltage node is a high voltage node and the second voltage node is a low voltage node, the second switch circuit is connected to a trigger which is an RC delay circuit consisting of a resistor and a capacitor, the second switch circuit and the trigger receive a low voltage control signal respectively for the second switches to switch and further invoke the first switches to switch, and the trigger produces a trigger signal for a predetermined interval such that substrate voltage of at least one second switch is changed when the first switch circuit and the second switch circuit are at transition, thereby reducing a threshold voltage of the at least one second switch and increasing circuit transition speed to output a high voltage control signal.

24. The level shifter as claimed in claim 23, wherein the first voltage node is a low positive voltage node and the second voltage node is a high negative voltage node, the first switch circuit is connected to a first trigger which is a RC delay circuit consisting of a resistor and a capacitor, the first switch circuit and the first trigger receive a low voltage control signal respectively for the first switches to switch and further invoke the second switches to switch, and the first trigger produces a trigger signal for a predetermined time such that substrate voltage of at least one first switch is changed when the first switch circuit and the second switch circuit are at transition.

25. The level shifter as claimed in claim 23, further comprising third and fourth switches coupled between the first and the second switch circuits, thereby providing a function of current limit.

26. The level shifter as claimed in claim 25, wherein the first switches, the third switch and the fourth switch are P-type MOS transistors, and the second switches are N-type MOS transistors.

* * * * *